(12) United States Patent
Reynolds

(10) Patent No.: US 8,576,075 B2
(45) Date of Patent: Nov. 5, 2013

(54) METHODS AND APPARATUS FOR RFID TAG PLACEMENT

(75) Inventor: Matthew S. Reynolds, Durham, NC (US)

(73) Assignee: Trimble Navigation Limited, Sunnyvale, CA (US)

( * ) Notice: Subject to any disclaimer, the term of this patent is extended or adjusted under 35 U.S.C. 154(b) by 948 days.

(21) Appl. No.: 12/698,689

(22) Filed: Feb. 2, 2010

(65) Prior Publication Data
US 2010/0134290 A1 Jun. 3, 2010

Related U.S. Application Data

(62) Division of application No. 11/459,634, filed on Jul. 24, 2006, now Pat. No. 7,683,780.

(51) Int. Cl.
G08B 13/14 (2006.01)
(52) U.S. Cl.
USPC ............. 340/572.1; 340/572.8; 340/539.1; 340/539.13; 340/825.49; 340/825.69; 340/10.1; 340/10.4
(58) Field of Classification Search
USPC ........ 340/572.1, 572.4, 572.7, 572.8, 539.1, 340/539.13, 825.49, 825.69, 10.1, 10.4; 342/104, 109, 118, 174
See application file for complete search history.

(56) References Cited

U.S. PATENT DOCUMENTS

| | | |
|---|---|---|
| 4,210,910 A | 7/1980 | Wohlers |
| 4,672,227 A | 6/1987 | Lagree et al. |
| 4,747,061 A | 5/1988 | Lagree et al. |
| 4,791,255 A | 12/1988 | Eliezer |
| 4,894,796 A | 1/1990 | Engel et al. |
| 4,924,210 A | 5/1990 | Matsui et al. |
| 5,397,868 A | 3/1995 | Smith et al. |
| 5,425,032 A | 6/1995 | Shloss et al. |
| 5,537,398 A | 7/1996 | Siwiak |
| 5,583,850 A | 12/1996 | Snodgrass et al. |
| 5,604,486 A | 2/1997 | Lauro et al. |
| 5,638,295 A | 6/1997 | Lagree et al. |
| 5,686,902 A * | 11/1997 | Reis et al. ................. 340/10.2 |
| 5,974,078 A | 10/1999 | Tuttle et al. |
| 5,986,570 A | 11/1999 | Black et al. |
| 5,990,820 A | 11/1999 | Tan |
| 6,084,530 A | 7/2000 | Pidwerbetsky et al. |

(Continued)

FOREIGN PATENT DOCUMENTS

| | | |
|---|---|---|
| WO | WO-99/34526 | 7/1999 |
| WO | WO-2006/093984 A | 9/2006 |

OTHER PUBLICATIONS

Advisory Action for U.S. Appl. No. 11/167,401 dated Jan. 15, 2010 (4 pages).

(Continued)

*Primary Examiner* — Hung T. Nguyen
(74) *Attorney, Agent, or Firm* — Foley & Lardner LLP; John D. Lanza

(57) ABSTRACT

Systems and methods for placing RFID tags on objects are shown and described. The method includes scanning an object and analyzing one or more reflected signals from the to determine a suggested location for placement of an RFID tag. The scan can be accomplished using a scanning device having an antenna that operates in the near field of the object to measure at least one RF property of the reflected signal from the object.

21 Claims, 7 Drawing Sheets

(56) References Cited

U.S. PATENT DOCUMENTS

| | | | |
|---|---|---|---|
| 6,122,329 | A | 9/2000 | Zai et al. |
| 6,172,609 | B1 | 1/2001 | Lu et al. |
| 6,204,750 | B1 | 3/2001 | Scheelen |
| 6,334,051 | B1 | 12/2001 | Tsurumi et al. |
| 6,375,780 | B1 | 4/2002 | Tuttle et al. |
| 6,492,933 | B1 | 12/2002 | McEwan |
| 6,509,828 | B2 | 1/2003 | Bolavage et al. |
| 6,529,488 | B2 | 3/2003 | Urs et al. |
| 6,563,417 | B1 | 5/2003 | Shaw |
| 6,577,216 | B2 | 6/2003 | Turner et al. |
| 6,590,481 | B2 | 7/2003 | Turner et al. |
| 6,617,962 | B1 | 9/2003 | Horwitz et al. |
| 6,631,170 | B1 | 10/2003 | Gu |
| 6,674,327 | B2 | 1/2004 | Harberts |
| 6,735,426 | B1 | 5/2004 | Pau |
| 6,801,109 | B2 | 10/2004 | Simms |
| 6,812,824 | B1 | 11/2004 | Goldinger et al. |
| 6,812,841 | B2 | 11/2004 | Heinrich et al. |
| 6,849,967 | B2 | 2/2005 | Lathrop et al. |
| 6,861,930 | B2 | 3/2005 | Simms et al. |
| 6,995,327 | B1 | 2/2006 | Shepstone et al. |
| 7,002,505 | B2 | 2/2006 | Hughes |
| 7,075,412 | B1 | 7/2006 | Reynolds et al. |
| 7,119,736 | B2 | 10/2006 | Heide et al. |
| 7,193,504 | B2 | 3/2007 | Carrender et al. |
| 7,215,976 | B2 | 5/2007 | Brideglall |
| 7,227,449 | B2 | 6/2007 | Bonneau et al. |
| 7,265,674 | B2 | 9/2007 | Tuttle |
| 7,327,775 | B1 | 2/2008 | Gu |
| 7,383,025 | B2 | 6/2008 | Xuan et al. |
| 7,391,329 | B2 | 6/2008 | Humes et al. |
| 7,411,506 | B2 | 8/2008 | Volpi et al. |
| 2002/0079741 | A1 | 6/2002 | Anderson |
| 2002/0154653 | A1 | 10/2002 | Benveniste |
| 2003/0104848 | A1 | 6/2003 | Brideglall |
| 2003/0214389 | A1 | 11/2003 | Arneson et al. |
| 2004/0022204 | A1 | 2/2004 | Trembley |
| 2004/0190092 | A1 | 9/2004 | Silverbrook et al. |
| 2004/0196177 | A1 | 10/2004 | Billington et al. |
| 2004/0199297 | A1 | 10/2004 | Schaper et al. |
| 2004/0222878 | A1 | 11/2004 | Juels |
| 2005/0035849 | A1 | 2/2005 | Yizhack |
| 2005/0156806 | A1* | 7/2005 | Ohta et al. ............... 343/834 |
| 2005/0270158 | A1* | 12/2005 | Corbett, Jr. ............. 340/572.1 |
| 2005/0280505 | A1 | 12/2005 | Humes et al. |
| 2005/0286660 | A1 | 12/2005 | Nysen et al. |
| 2006/0022815 | A1 | 2/2006 | Fischer et al. |
| 2006/0023813 | A1 | 2/2006 | Jaffe et al. |
| 2006/0028069 | A1 | 2/2006 | Loucks et al. |
| 2006/0129798 | A1 | 6/2006 | Bance et al. |
| 2006/0186995 | A1 | 8/2006 | Wu et al. |
| 2007/0046625 | A1* | 3/2007 | Yee ...................... 345/156 |
| 2008/0150699 | A1 | 6/2008 | Ohara et al. |

OTHER PUBLICATIONS

EPC Radio Frequency Identity Protocols, Class-1 Generation-2 UHF RFID, Conformance Requirements, Version 1.0.2. Feb. 2005 (40 pages).

International Preliminary Report on Patentability, PCT/US2006/023180, mailed on Jan. 17, 2008 (7 pages).

International Search Report for PCT/US2007/084487 mailed Sep. 3, 2008 (7 pages).

International Search Report, PCT/US2006/023180, mailed on May 15, 2007 (2 pages).

International Search Report, PCT/US2008/051861, mailed on Dec. 23, 2008 (4 pages).

Juels, A. "RFID Security and Privacy: A Research Survey" XP002375728 Retrieved from the Internet Sep. 28, 2005 (20 pages).

Kwak, J. et al., "RFID System with Fairness Within the Framework of Security and Privacy" XP019026267, vol. 3813, Jan. 1, 2005 (12 pages).

Notice of Allowance for U.S. Appl. No. 10/448,053 dated Mar. 14, 2006 (5 pages).

Notice of Allowance for U.S. Appl. No. 11/167,401 dated Apr. 5, 2010 (4 pages).

Notice of Allowance for U.S. Appl. No. 11/422,075 dated Dec. 15, 2009 (6 pages).

Notice of Allowance for U.S. Appl. No. 11/459,634 dated Nov. 4, 2009 (9 pages).

Notice of Allowance for U.S. Appl. No. 11/559,227 dated Sep. 16, 2011 (5 pages).

Notice of Allowance for U.S. Appl. No. 11/559,248 dated May 26, 2011 (5 pages).

Office Action for U.S. Appl. No. 10/448,053 dated Oct. 31, 2005 (12 pages).

Office Action for U.S. Appl. No. 11/167,401 dated Feb. 5, 2009 (9 pages).

Office Action for U.S. Appl. No. 11/167,401 dated Mar. 19, 2008 (11 pages).

Office Action for U.S. Appl. No. 11/167,401 dated Aug. 17, 2009 (10 pages).

Office Action for U.S. Appl. No. 11/167,401 dated Aug. 20, 2008 (13 pages).

Office Action for U.S. Appl. No. 11/422,075 dated Jul. 23, 2009 (4 pages).

Office Action for U.S. Appl. No. 11/559,227 dated Mar. 18, 2011 (11 pages).

Office Action for U.S. Appl. No. 11/559,227 dated Apr. 2, 2010 (7 pages).

Office Action for U.S. Appl. No. 11/559,227 dated Sep. 21, 2010 (11 pages).

Restriction Requirement for U.S. Appl. No. 11/459,634 dated Jun. 8, 2009 (5 pages).

Written Opinion of the International Search Authority for PCT/US2007/084487 mailed Sep. 3, 2008 (9 pages).

Written Opinion of the International Search Authority from PCT/US2008/051861, mailed on Dec. 23, 2008 (7 pages).

Written Opinion of the International Search Authority, PCT/US2006/023180, mailed on May 15, 2007 (6 pages).

* cited by examiner

METHODS AND APPARATUS FOR RFID TAG PLACEMENT

RELATED APPLICATION

This present application claims priority to and is a divisional of U.S. patent application Ser. No. 11/459,634, entitled "Methods and Apparatus for RFID Tag Placement", filed Jul. 24, 2006, now U.S. Pat. No. 7,683,780, incorporated herein by reference.

FIELD OF THE DISCLOSURE

This application relates generally to radio frequency identification (RFID) tag placement. More specifically, the application relates to apparatus and methods for determining the placement of a radio frequency identification tag.

BACKGROUND

Presently, various retail chains and others are implementing the use of RFID tags in many ways. However, there are large numbers of packaged goods that are not yet tagged with RFID tags. Furthermore, new types of packaged goods are designed all the time. At present there is no automated process for determining the optimal tag type or tag placement for those packaged goods. Because there is a great deal of variability in the radio frequency (RF) properties of packaged goods, and because at present, packages are not designed with RF properties in mind, this has created a pressing need for RFID tag placement systems and methods.

Currently, determining the optimal location to place a particular type of RFID tag is done manually, in the far-field of the packed good, by placing a tag or several tags at various locations on the surface of the packaged good. A human measures the read range of the tag in free space for that particular tag placement or measures a read count at a fixed read range. If multiple tag types are considered for use on a particular packaged good, each tag type is applied to the packaged good. Given the proliferation of different tag types, this makes the current practice even more time consuming and inefficient. This process is slow, costly, and prone to inaccuracy or human prejudice.

Furthermore, no widely accepted formal method has been described for designing new types of packaging, or variations of existing packaging, that are specifically designed for use with RFID tags.

SUMMARY

In various aspects, the invention features methods and apparatuses for determining the location to place an RFID tag on a packaged good, and optionally for placing a tag on that good. In one embodiment, an electromagnetic field is scanned around the packaged good in the near field, and the far field behavior of one or more candidate RFID tags attached to that packaged good are estimated and optimized based on this near field measurement, coupled with a model of the behavior of each particular tag.

In a specific embodiment, the placement apparatus scans an electromagnetic field around the packaged good, and the device derives a relative indication of the suitability of any given location for that particular tag, based on a near-field measurement of the packaged goods' RF properties, which are extrapolated to an estimate of the far-field properties if a particular tag type is employed. Typical RF properties to be measured as an indicator of near-field behavior include, but are not limited to, the permeability, permittivity, or loss tangent of the packaged good, or the impedance or complex return loss given a particular probe antenna. The scanning may be either electrical (as by the use of a phased array antenna, or an array of many independent antenna elements), or mechanical, in which either the packaged good is moved with respect to the placement apparatus or vice versa.

Other aspects of the invention feature using the measurement gathered by the placement apparatus as a component of a computer modeling or Computer Aided Design (CAD) system for designing new packaging materials and package designs. The CAD system incorporates near-field measurements in simulating the far-field behavior of a tagged packaged good.

In one aspect, the invention features a method of determining a location to place an RFID tag on an object. The method includes scanning an object, with a scanning device having an antenna in the near field of the object, to measure at least one RF property of the reflected signal from the object and analyzing the reflected signal to determine a suggested location for placement of an RFID tag.

In various embodiments, the method includes scanning the object in the near field of the object to measure the permeability of the object at one or more locations on a surface of the object, scanning the object in the near field of the object to measure the permittivity of the object at one or more locations on a surface of the object, and scanning the object in the near field of the object to measure the loss tangent of the object at one or more locations on a surface of the object.

In various embodiments, the method includes scanning the object in the near field of the object to measure the impedance of the antenna when influenced by the object at one or more locations on a surface of the object and scanning the object in the near field of the object to measure the complex return loss of the antenna when influenced by the object.

In one embodiment, the scanning is done electrically. In another embodiment, the scanning is done mechanically.

In one embodiment, the antenna is an array of antenna elements. Examples of antenna elements include, but are not limited to, a dipole antenna, a resonant coil antenna, a non-resonant coil antenna, a microstrip antenna, a patch antenna, a slot antenna, a spiral antenna, and a logarithmic antenna. In one embodiment, the antenna element is interchangeable. In some embodiments, the antenna is selected to substantially mimic an RFID tag antenna.

In some embodiments, the analyzing includes estimating the far-field radiation pattern of an antenna on the object based on the measured at least one property, analyzing the magnitude of the reflected signal, analyzing the phase of the reflected signal, and analyzing the reflected signal for nonlinear behavior.

In various embodiments, the method includes calibrating the scanning device prior to scanning the object. In further embodiments, the calibrating includes reading calibration data stored with an antenna element that is part of the scanning device and executing a free-space calibration routine. In some of these embodiments, the analyzing includes generating a ratio of the reflected signal to the calibration signal and generating a figure of merit of location quality.

In some embodiments, the method includes indicating a result of the analysis to the end-user of the scanning device. In further embodiments, the indicating includes displaying a suggested location for placing the RFID tag, providing an audio alert to the end-user of the scanning device, and marking the object in the location suggested for tag placement.

In another aspect, the invention features an apparatus for scanning an object in the near field. The apparatus includes a housing that encloses an RF source, a transmitter in communication with the RF source, an antenna in communication with the transmitter, and a receiver. The apparatus also includes a controller in communication with at least the RF source and the receiver. The controller generates a scan signal that results in irradiation of an object, receives a reflection signal of the irradiated object, and analyzes at least one property of the reflection signal to determine a suggested location for placement of an RFID tag.

BRIEF DESCRIPTION OF THE DRAWINGS

The following figures depict certain illustrative embodiments of the invention in which like reference numerals refer to like elements. These depicted embodiments are to be understood as illustrative of the invention and not as limiting in any way.

DETAILED DESCRIPTION

Figure 1:
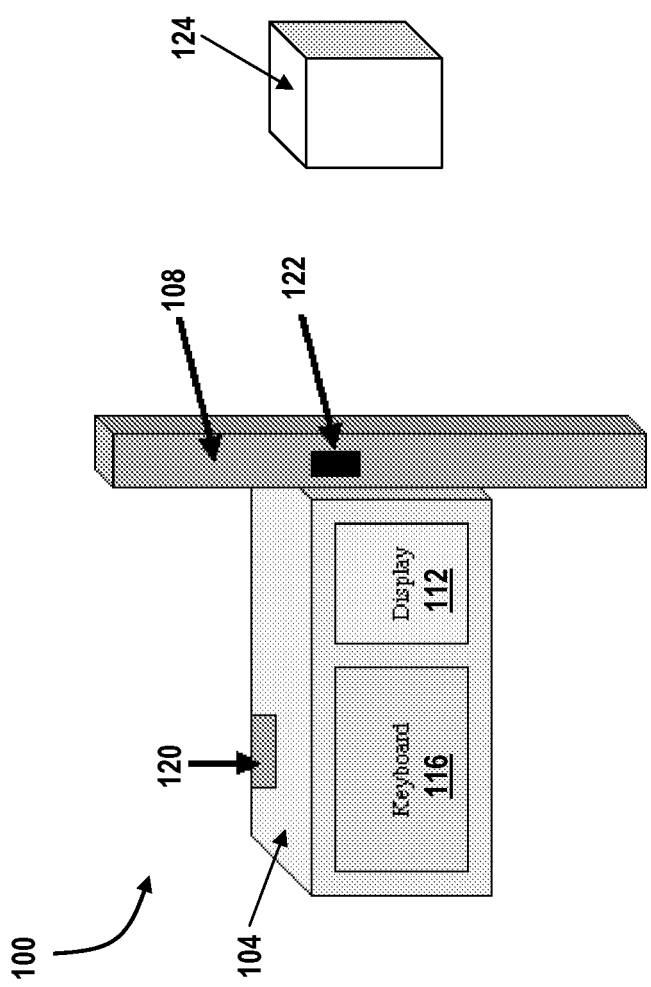
FIG. 1 depicts a block diagram of an embodiment of an RFID tag placement apparatus.

With reference to FIG. 1, an embodiment of a tag placement 100 apparatus is described. The apparatus includes a housing 104 that includes and encloses various components and an antenna element 108. The housing can include a display 112, a keyboard 116, and a optional port 120.

The housing 104 can take any number of various form factors. For example, in one embodiment, the form factor is that of a handle held device such as a multimeter. Other hand held form factors include, but are not limited to, a personal digital assistant (PDA), a cell phone, a portable gaming device (e.g., the PLAYSTATION PORTABLE manufactured by Sony, GAMEBOY ADVANCE manufactured by Nintendo, and the like), a portable DVD player, a portable music player such as the IPOD manufactured by Apple Computer, a television remote control, and the like.

The housing 104 can be made of any suitable material. For example, plastics and polymers can be used. In addition, various composite materials can be used. Depending on the desired mechanical and electrical characteristics, the housing can be constructed using various materials. In some embodiments, the housing is constructed of non-conductive materials such as plastics with low loss tangents and good dielectric properties at radio frequencies, such as polycarbonate, ABS, or styrene in order to provide relative electromagnetic transparency for antenna element 108.

In another embodiment, the placement apparatus functionality described below may be included within an RFID reader, particularly an RFID reader employing software-defined radio technology. In this case the RFID reader functionality may be preserved and additional functions (such as the ability to perform calibrated RF measurements) may be added specifically to perform the functions of the placement apparatus 100 defined herein.

In one embodiment, the design of the antenna element 108 is chosen based on the antenna's near field properties. In various embodiments, the antenna element consists of either a single element, multiple switched elements, or as part of a phased array or other multi-element antenna. The antenna element 108 may include one or more of the following antenna types: dipoles, resonant or unresonant coils, microstrip antennas, patch antennas with any dielectric, slot antennas, spiral antennas including logarithmic spiral antennas, or any other type of antenna element. In certain embodiments, multiple antenna elements 108 are present on the placement apparatus 100. The antenna elements 108 may be switched or their signals otherwise combined, or fed to multiple receivers controlled by the same or an interconnected controller, as described in more detail below.

In another embodiment, the antenna element 108 is interchangeable instead of being permanently affixed to the placement apparatus 100. If the antenna element 108 is interchangeable, the antenna elements 108 may contain a device (not shown) such as a resistor, switch contacts, diode matrix, or a memory which can be used to signal one or more of the presence of the antenna, the antenna type, or the radio frequency parameters of the antenna to a controller that is part of the electronics of the placement apparatus 108. The antenna element 108 may be a duplicate or similar in design to the antenna type of a candidate RFID tag type, or the antenna element 108 may be different in physical construction but relatable in RF parameters to the candidate RFID tag type. Additionally, the antenna element 108 may also incorporate an actual RFID tag of the type that is being tested, along with a probe (such as a high impedance probe) to "sniff" the signals present on the actual RFID tag's antenna. In some embodiments, a compatibility chart between RFID tag type and antenna type is provided with the placement apparatus 100 (or in the control software for an optional external computer) for one or more different RFID tag types, because the same antenna type may be used to characterize one or more different RFID tag types.

In one embodiment, the antenna element 108 includes a memory element 122 that stores calibration and potentially other information about the antenna element 108. The memory element 112 can be any type of memory element. For example, the memory element 122 can be any of the following: an EEPROM, a ROM, a PROM, a RAM, an SRAM, a diode matrix, a set of switch contacts, and the like.

The display 112 can take various forms. For example, in one embodiment the display 112 is a liquid crystal display (LCD) to display graphic or alphanumeric characters. In other embodiments, the display 112 is a plasma type display or a cathode ray tube (CRT) type display. Further, the display can include a phosphor emission screen, an emissive display made of a light-emitting material, such as an organic compound, an organometallic compound, an oligomer, or a polymer, or another emissive display. In other embodiment, the display 112 includes, one or more organic light emitting diodes (OLED), one or more light emitting diodes (LED), an LED bar graph, an analog meter movement, or any other human readable display element. An audio transducer (not shown) can be included as part of display 112 or separate therefrom. The audio transducer (e.g., a speaker) produces an audible alert to indicate the suitability of the location for placement of the RFID tag. In still other embodiments, the display 112 may comprise or include a haptic interface such as a vibrating motor that is used to provide feedback to the operator of the device.

The keyboard 116 can take various forms. For example, the keyboard 116 can be a miniature QWERTY type keyboard such as those found on PDAs. In other embodiments, the keyboard 116 is a Dvorak type keyboard. In addition, a touch screen type keyboard 116 can be displayed on the display 112. Or an ordinary keyboard and/or mouse may be included in the device or plugged in by means of a port such as a USB or PS/2 port.

As shown in FIG. 1, a port 120 may be provided in the housing to allow the placement apparatus to connect to other computing devices. The port can take various forms such as a USB port, an RS-232 port, an Ethernet port, a Firewire port, a 802.11a/b/g port, a USB 2.0 port, or some other type of port.

As a general operational overview, the placement apparatus 100 irradiates an object 124 with electromagnetic energy in the near-field of the antenna element 108. The reflected response is captured and analyzed. A suggested RFID tag placement location is communicated to the end-user of the placement apparatus in response to the analysis. Although shown as a single item, the object 124 can also be composite packaged goods such as cases or pallets of goods, either all of the same type or heterogeneous in nature.

As will be described in more detail below, the placement apparatus 100 may either be calibrated for use with a certain tag type, or it may measure electromagnetic parameters that allow (either manually or automatically) the determination of what tag type should be used for that particular packaged good. For example, the candidate tag type may be selected from a family of existing tag types, which can be implemented in different forms. For example, the candidate RFID tags can be represented digitally, in a library of mathematical models that indicate the RF properties of various tags, or physically in terms of a number of physical instantiations of RFID tags. In the case of physical representations, the candidate tags can be probe antennas engineered to represent different tag types or by a plurality of different actual tags.

Figure 2:
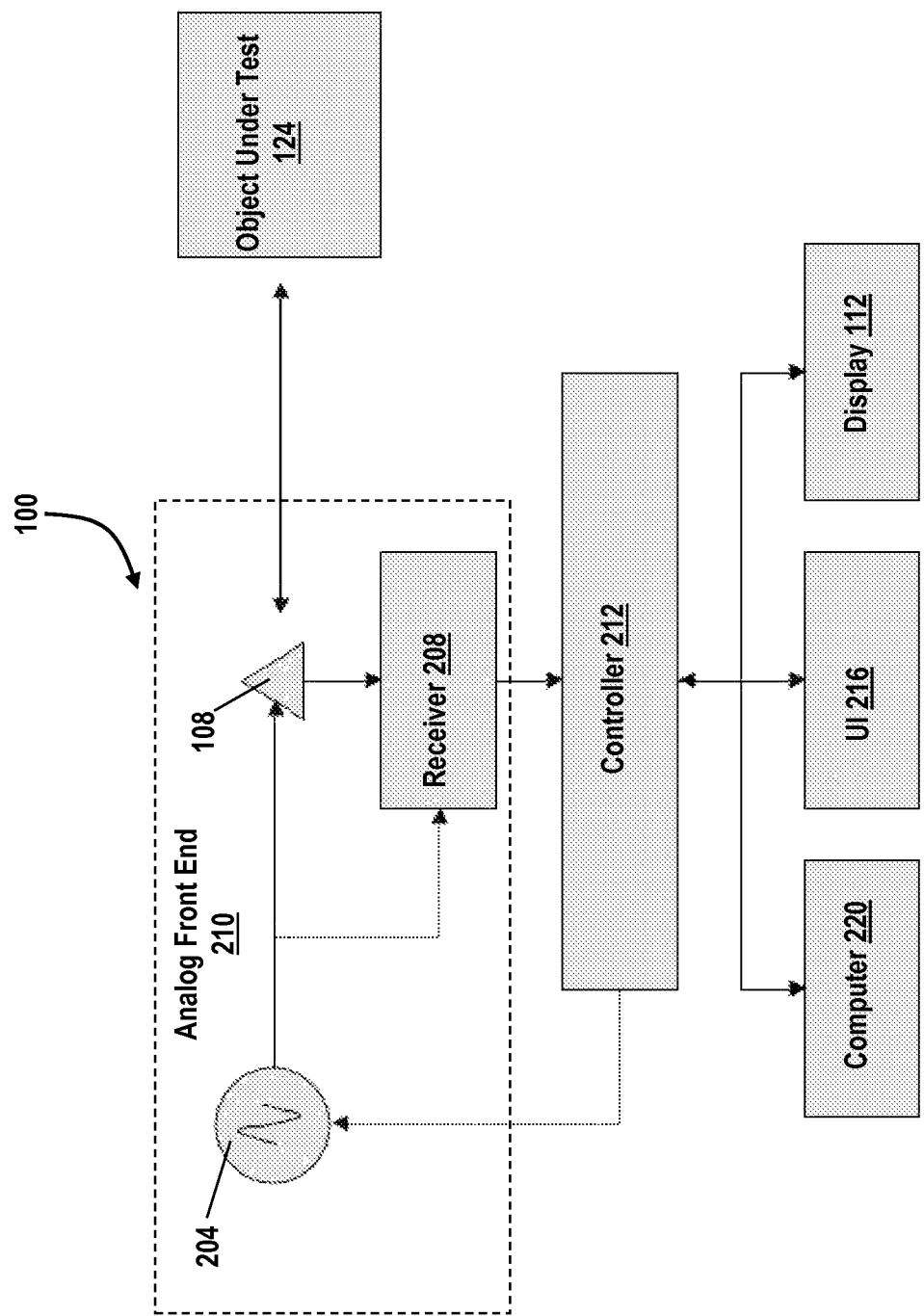
FIG. 2 depicts a block diagram of an embodiment of the RFID tag placement apparatus.

With reference to FIG. 2, a block diagram of an embodiment of various electrical components that can be placed within the housing 104 of the placement apparatus 100 is shown and described. In some embodiments, the antenna 108 communicates with the various electrical components that are encapsulated within the housing 104. The electrical components can include, but are not limited to a signal source 204, a receiver 208, and a controller 212. If a display 112 is present, a user interface 216 can be displayed to the user of the placement apparatus to allow the user to interact with the controller 212. Optionally, the placement apparatus 100 can communicate with an external computer 220.

The signal source 204 can take various forms. In one embodiment, the signal source 204 is an RF signal source. Various RF signal sources can be used. For example, the signal source 204 can be an unstabilized oscillator, a surface acoustic wave (SAW) oscillator, a voltage controlled oscillator or a phased lock loop synthesizer. Although shown as having a single signal source 204, in other embodiments multiple signal sources 204 are present. If multiple signal sources 204 are used, their signals may be switched or combined to form either a monochromatic or multitone excitation signal.

In other embodiments, the signal source 204 can include, a modulator (not shown) which produces a direct sequence spread spectrum excitation, or an ultrawideband excitation. Using such a system, the placement apparatus 100 can simultaneously probe at multiple frequencies.

During operation, the signal source 204 produces at least one fixed frequency. Also, the signal source 204 can operate in a swept-frequency mode. Further, the signal source 204 can operate at more than one frequency under the control of the controller 212 as when operating in a frequency hopping mode, or in a multi-band mode.

The receiver 208 can take various forms. For example, the receiver 208 may employ a directional coupler or circulator to separate the transmitted signal from the received signal. Each of those components can be connected to one or more of: a power detector such as a logarithmic amplifier, a phase detector such as a Gilbert cell multiplier or a passive mixer, a quadrature demodulator or homodyne receiver circuit, a superheterodyne circuit connected to a magnitude and/or phase detector, an ultrawideband detector, a spread spectrum correlator, or any other equivalent embodiment.

During operation, the receiver 208 receives a reflected signal from the signal source 204 via the antenna 108 while the signal impinges upon the object under test 124. The receiver 208 produces signals corresponding to RF properties, such as, for example, the magnitude and the phase of the signal reflected from the object under test 124. In other embodiments, the receiver 208 investigates the reflected signal for evidence of nonlinear behavior such as the production of harmonics or sub-harmonics of the excitation signal.

Together, the antenna 108, the signal source 204 and the receiver 208 can conceptually be thought of as a "front end" 210 of the placement apparatus. Further details of the front end 210 are described below with reference to FIG. 3.

The controller 212 can include either an analog circuit or a digital circuit such as discrete logic, a field programmable gate array, a microprocessor, microcontroller, or digital signal processor (DSP). The controller 212 performs functions such as setting the operating frequency (if the signal source can be tuned to more than one frequency, as in a frequency hopping or swept frequency case) of the signal source 204, interpreting the output of the receiver 208 including performing any signal processing or filtering required (including averaging), and displaying the result of the RF parameter measurement on the optional display 112. In some embodiments, the controller 212 communicates with the optional user interface 216, which may be used to command the placement apparatus 100 into different operating modes. Also, the controller 212 can communicate with the optional external computer 220, which can be used to operate the placement apparatus 100 in certain embodiments. Further details of the controller 212 are described with reference to FIG. 4.

In one embodiment, the optional user interface 216 includes one or more switches, knobs, or buttons (e.g., a keyboard). The user interface 216 commands the controller 212 and sets the placement apparatus 100 into different operating modes. Another function that can be provided by the user interface is to provide a means to indicate to the controller 212 that the user wishes to calibrate the device, as described in more detail below. Further, the user interface facilitates changing the RFID tag type that the placement apparatus 100 is configured to use or changing any other configurable parameter of the placement apparatus 100.

The optional external computer 220 can remotely set the controller 212 into any or all operating modes of the placement apparatus 100. The external computer 220 can operate alone or in combination with a programmatic control of the placement apparatus 100. The external computer 220 communicates with the placement apparatus via the port 120. The external computer 220 can take many forms. For example, the external computer 220 can be a PC, a MAC, a PDA, or any other device with a processor capable of executing programming instructions. Or the optional external computer 220 may be part of an industrial apparatus such as a Programmable Logic Controller (PLC) that controls a conveyor system or a motion control system.

Figure 3:
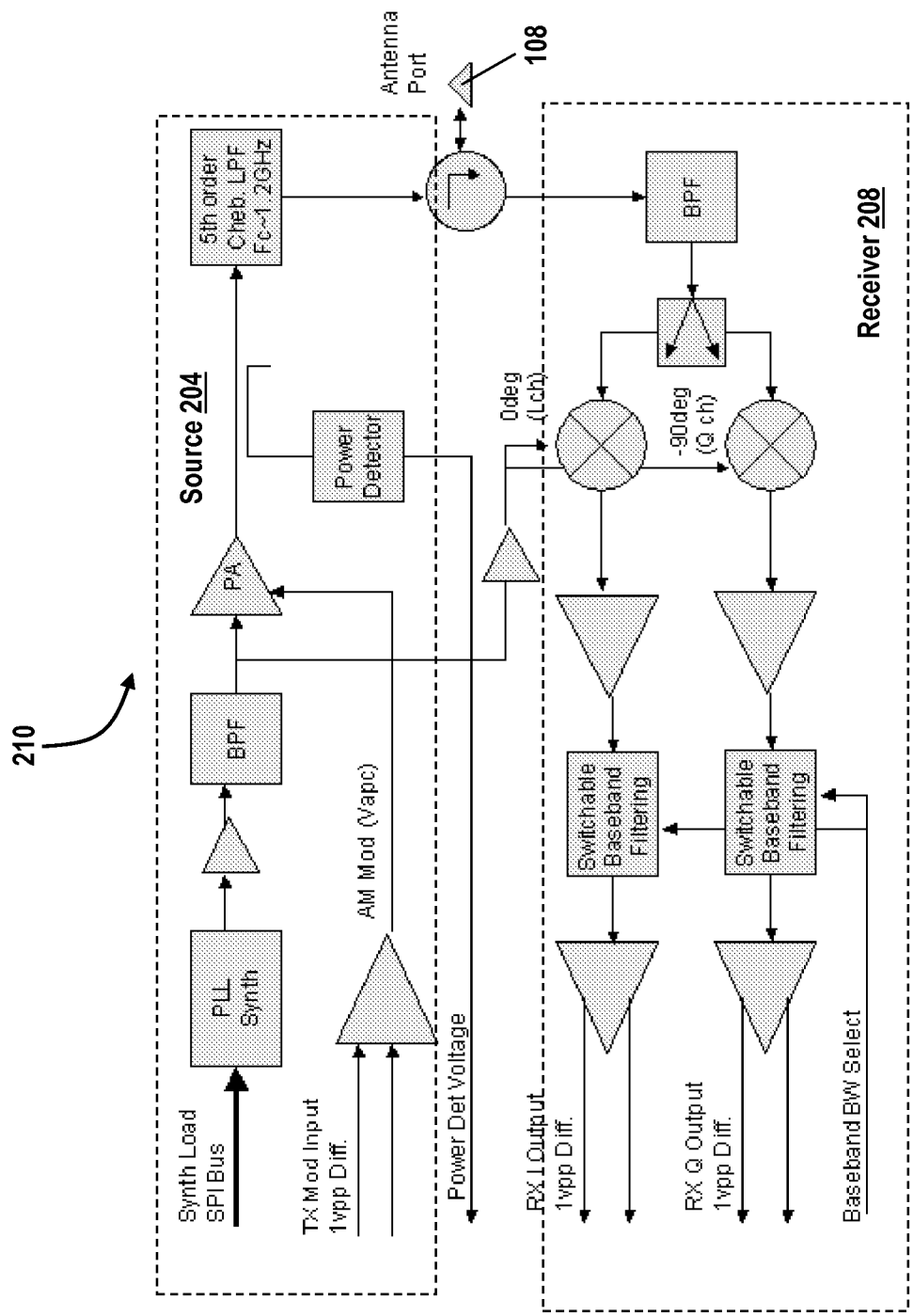
FIG. 3 depicts a block diagram of an embodiment of a front end of the RFID tag placement apparatus.

With reference to FIG. 3, one embodiment of the front-end 210 features various processing circuitry. As shown in FIG. 2, the front-end 210 includes the antenna 108, the source 204, and the receiver 208.

In one embodiment, the source 204 includes components such as an oscillator, voltage controlled oscillator, SAW resonator oscillator, phase lock loop, bandpass filters, power amplifiers, and the like. Other components that are not shown can also be included. Various combinations of the components can also be used.

In one embodiment, the receiver 208 includes components such as an in-phase demodulator, a quadrature demodulator, one or more filters, and one or more amplifiers. Other components that are not shown can also be included. Various combinations of the components can also be used.

In operation, the antenna 108 and the receiver circuitry 208 cooperate to sample the local RF environment (e.g., the near-field reflections of an impinging signal) of the object under test 124. The receiver 208 generates one or more received signals 208 (e.g., in-phase and quadrature signals). These signals are also referred to as response signals 208 throughout the specification. Further, the receiver circuitry 208 cooperates with the controller 212 to determine a suggested location to place the RFID tag given the near-field RF characteristics of the object under test 124.

Figure 4:
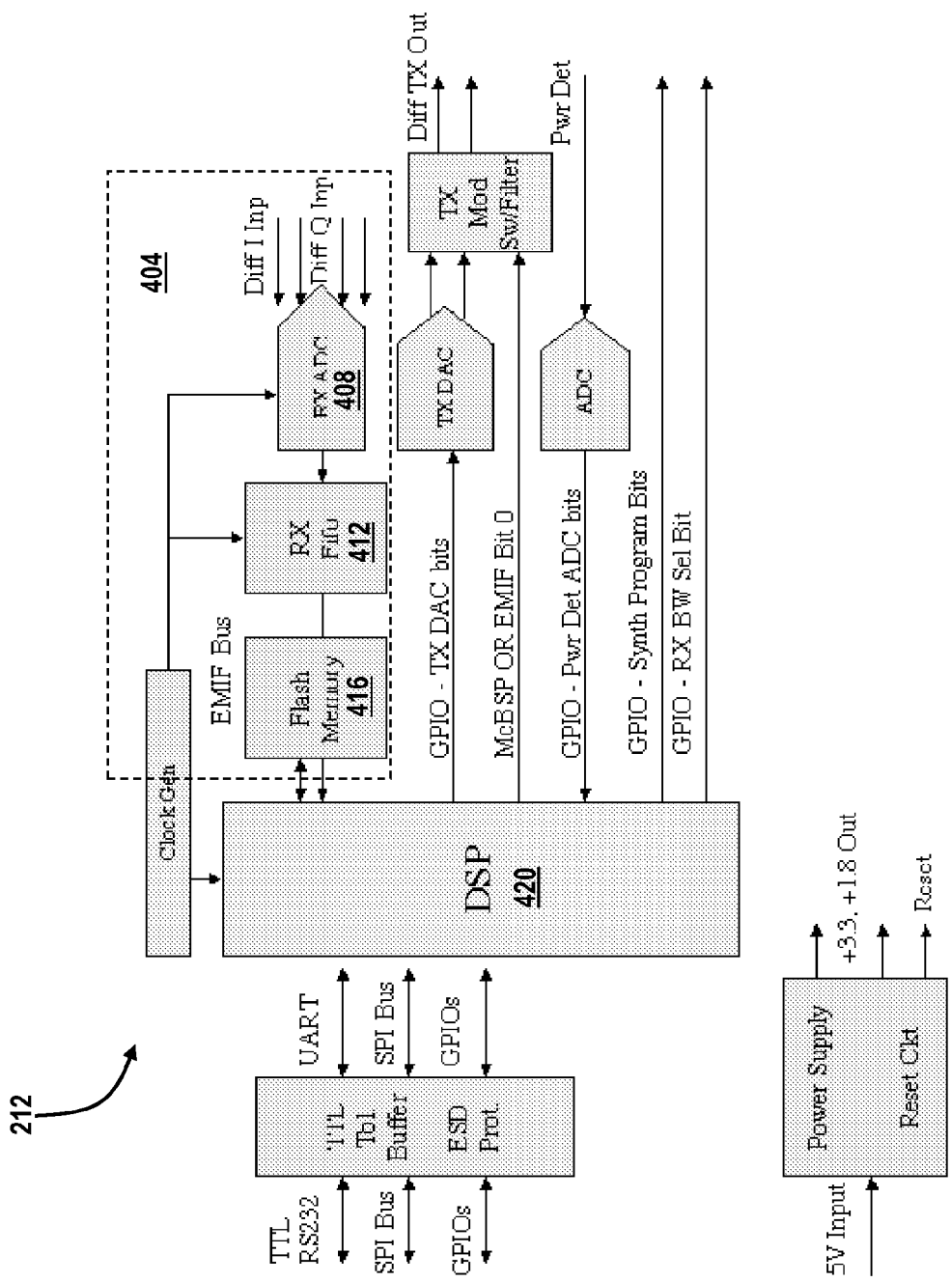
FIG. 4 is a block diagram of an embodiment of digital circuitry of the RFID tag placement apparatus.

With reference to FIG. 4, one embodiment of the controller 212 is shown and described. As shown in FIG. 4, the controller 212 includes a digital receiver section 404. In one embodiment, the digital receiver section 404 includes an analog to digital converter 408 (RX ADC) in communicating with to the front-end circuitry 210 of FIG. 2 to receive the response signals from the main reader circuitry 404. The RX ADC 408 is also communicates with a first-in-first-out (RX FIFO) memory 412. Although shown as having a single ADC 408, other embodiments can include additional RX ADCs 408 can be used. For example, each of the in-phase signal and quadrature signals can be fed into a respective ADC 408. Also, additional FIFO memories 412 can be used to store each of the respective digitized signals. In addition, the digitized signals can be stored in a flash memory 416 and/or fed to a digital signal processor (DSP) 420 for further processing.

In operation, once the received antenna signals are received and digitized, the digitized signals are communicated to the DSP 420. In some embodiments, the DSP 420 periodically accesses the flash memory 416, retrieves the digitized signals either from the FIFO memory 412 or as stored in the DSP's internal memory or the external flash memory 416, and processes the digital signals. In one embodiment, the results of the DSP processing are communicated to the end user of the placement apparatus 100 via the display 112.

Figure 5:
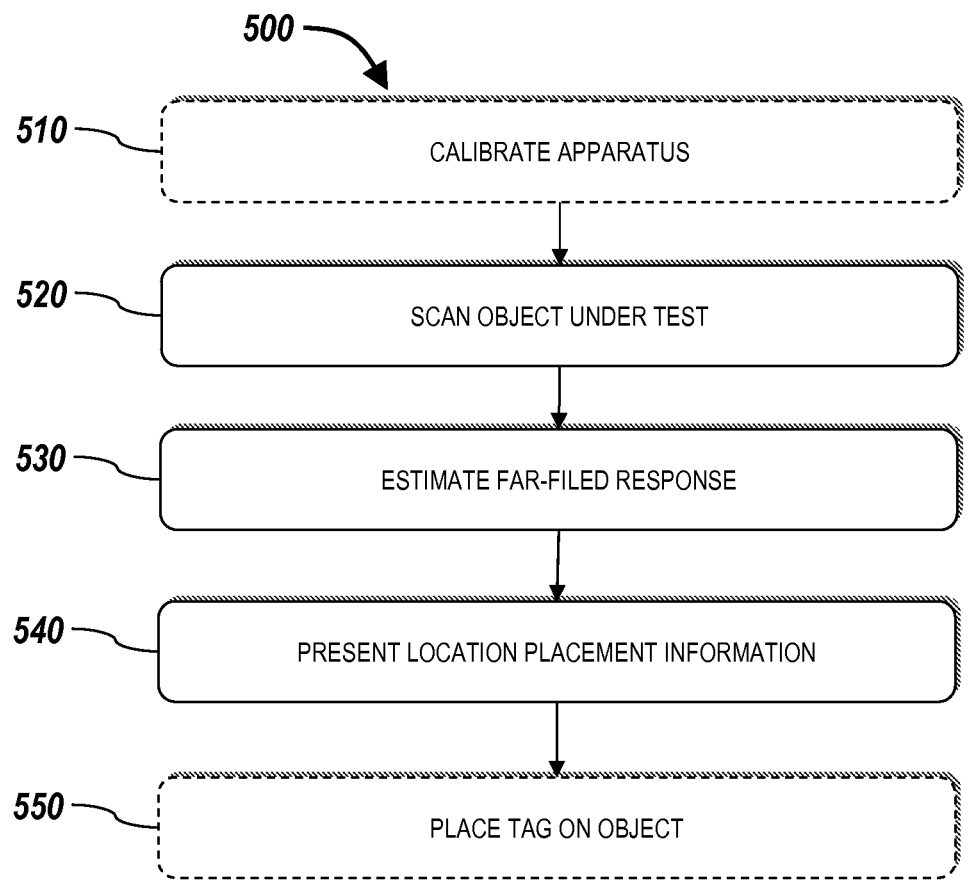
FIG. 5 is a flow chart of an embodiment of a method for placing an RFID tag on an object.

With reference to FIG. 5, a method 500 of placing an RFID tag on a packaged good 124 (e.g., the object under test 124) is shown and described. In one embodiment, the method includes calibrating (STEP 510) the placement apparatus 100 prior to scanning the packaged object 124. The method also includes scanning (STEP 520) the packaged good 124, estimating (STEP 530) the far-field response of the RFID tag response, presenting (STEP 540) RFID tag placement location information, and, optionally, placing (STEP 550) the RFID tag on the packaged good 124.

In one embodiment, calibrating (STEP 510) includes executing a free space calibration routine, which is described in more detail below with reference to FIG. 6. In another embodiment, previous calibration information or factory calibration information can be read from the memory 122 of the antenna 108.

After calibration (STEP 510), the placement apparatus 100 scans (STEP 520) the object under test 124. In one embodiment, an electrical scan is performed. In another embodiment, a mechanical scan is performed. For example, a robotic arm may physically move the placement apparatus 100 around the object under test 124. In various embodiments, the placement apparatus 100 sweeps the signal source 104 through a set of frequencies of interest. These frequencies may correspond with the desired operating frequency range of the RFID tag (for example 902-928 MHz in the US), or they may extend beyond the desired operating frequency range in order to determine whether the RFID tag would be tuned too high or too low in frequency when applied to the object under test 124. Or the frequencies under test are harmonics or sub-harmonics of a desired operating frequency range. In various embodiments, the object under test is scanned for one or more RF properties. For example, the RF properties can include but are not limited to, the permeability, permittivity, or loss tangent of object under test 124 as measured at a particular location, or the impedance or complex return loss given a particular probe antenna as measured at a particular location. Scanning, as used herein, refers to scanning one or more surfaces of the object under test 124. The surfaces can include outer surfaces, inner surfaces, any space between the outer and inner surfaces (e.g., within the interior of cardboard packing) of the object under test 124.

After scanning (STEP 520), the collected near-field electromagnetic characteristics are estimated (STEP 530) in the far-field. This estimate may be either explicit, as in the case where a transform is used to extrapolate near-field characteristics to far-field characteristics, or the estimate may be implicit, as when near-field characteristics are merely correlated to estimated far-field behavior without an explicit extrapolation step. In one embodiment, the estimation is accomplished using a fast Fourier transform (FFT). Other near-field to far-field transforms can also be used. In some embodiments, any of the family of Fourier transforms, holographic transforms, or integral methods may be used. Or a genetic algorithm optimization method may be used to perform this transformation. The placement apparatus 100 compares the reflected measurements at a particular frequency and particular antenna location on the surface of the packaged good with the calibration data stored in memory. In one embodiment, the controller 212 performs a calculation to generate a figure of merit that indicates the quality of a location. The figure of merit can indicate, for example, the relative suitability of a particular location for the placement of a particular type of tag. In one embodiment, the figure of merit can be a percentage that indicates the ratio of the observed reflectivity in the stored calibration table to the observed reflectivity at each particular candidate RFID tag placement on the surface of or inside the packaged good. In another embodiment the figure of merit may be an estimated far field read range given a particular location and tag type.

In determining the figure of merit, various additional factors can be included. For example, the placement apparatus 100 may also take in to account surface property information about the packaged good 124. This information can be derived from a database of the mechanical properties of the packaged good 124 or measured by the placement apparatus 100 by contact or non-contact means such as optical inspection, mechanical probing, ultrasonic probing, X-ray inspection, manual input from a human operator, or any other means of measurement.

This additional data can be combined with the measured near-field RF properties to form an overall ranking of the relative suitability of a particular candidate RFID tag location. Some of the additional factors include, but are not limited, to the adhesion of an adhesive RFID label at the location, the ability to print an RFID tag on the packaged good, the current or subsequent readability of another co-located automatic identification device or indicia such as a barcode, or the presence of another RFID tag. Other factors also include the current or subsequent readability of human readable characters (e.g., the brand name of the packaged good 124 or a UPC number as written or printed in numerals), the marketing suitability of the RFID tag location that includes aesthetic considerations, and the probability of damage to the RFID tag based upon some information about subsequent handling, either in transport or in use of that packaged good.

The suggested placement location indicated by the placement apparatus 100 as optimal may also take in to account yet additional factors. These factors may include for example the subsequent or ultimate destination of the packaged good, financial or business reasons to prefer one location over another, or for electrical reasons as in the case where a subsequent handler or user of the packaged good is known to have installed RFID reader equipment that only reads some types of tags or preferentially reads some types of tags better than others.

To enable the inclusion of any one or combination of the aforementioned factors to be in the final output location suggested by the placement apparatus 100, a fitness function may be employed. In one embodiment, the fitness function is constructed of a matrix consisting of a relative weighting of the factors discussed above. The matrix may be multiplied by a vector of measured, database provided, or human operator provided inputs for each of the aforementioned factors, as measured at each tested location on the packaged good, and a numeric score or ranking may be assigned to each candidate location. The placement apparatus 100 may then produce a single preferred location as its output, or it may store any intermediate results of this calculation, which is jointly referred to as a Product Information Dataset (PID) throughout the specification, in a database to assist in future placement recommendations for the same or similar packaged goods. The PID can have other uses, which are described in more detail below.

In other embodiments, the user can consider the other factors. For example, the user notes which locations on the package correspond to which percentage of the free space response. The user manually ranks these locations, considers other factors if desired, and decides on a candidate tag placement. The candidate RFID tag placement can be confirmed by applying an actual tag and performing a far-field or free space measurement.

In various embodiments, the placement apparatus 100 tracks of the figure of merit of each candidate location automatically and provides the user with a graphical map or image of the surface of the packaged good overlaid with an indication of the figure of merit of each particular location. This may be represented for example with a color coding where a particularly suitable location is colored in red where a particularly unsuitable location is colored in a dark color. This would be similar to a meteorological temperature chart. Other coloring schemes can also be used. For example, a hot (e.g., red) and cold (e.g., blue) coloring scheme can be used.

This process may be repeated by the user as needed to arrive at a satisfactory RFID tag placement location given a particular tag type. In other embodiments, the user performs the methods with a variety of different interchangeable antennas to determine the relative suitability of different tag types and thus choose a tag type best suited for a particular packaged good or for a fixed tag location (e.g., where product marketing requirements dictate that the RFID tag must be placed in a certain location and the placement apparatus 100 is used to determine which tag type is best suited for that location.)

The placement apparatus 100 evaluates the measurements and presents (STEP 540) a location placement suggestion to the user. The optional display 112 can be used to communicate a suggested location the user. The display can present the visual indication using a bar graph and the like. Also, audible alerts can be used. For example, a series of beeps or tones can be used to indicate a relative suitability of the suggested location. In one embodiment, one or more LED, which can be the same or different colors, can be used to indicate the relative strength of the suggested location. Also, a recorded voice can be used. Also, if an external computer is connected to the placement apparatus 100, the figure out merit can be communicated to the user at the external computer.

In one embodiment after a desired location is selected, the placement apparatus 100 aids or actually places the RFID tag on the object under test 124. For example, the RFID tag is printed on the object under test 124 by a printing device that is either integral with the placement apparatus 100 or separated therefrom. The RFID tag can be printed using ink jet principles, lithography, or any other means capable of generating an electrical circuit including either or both of an antenna or a tag circuit directly on the package itself, or on an intermediate substrate to be attached to the package. In other embodiments, a robotic arm attaches the RFID tag at the suggested location.

Figure 6:
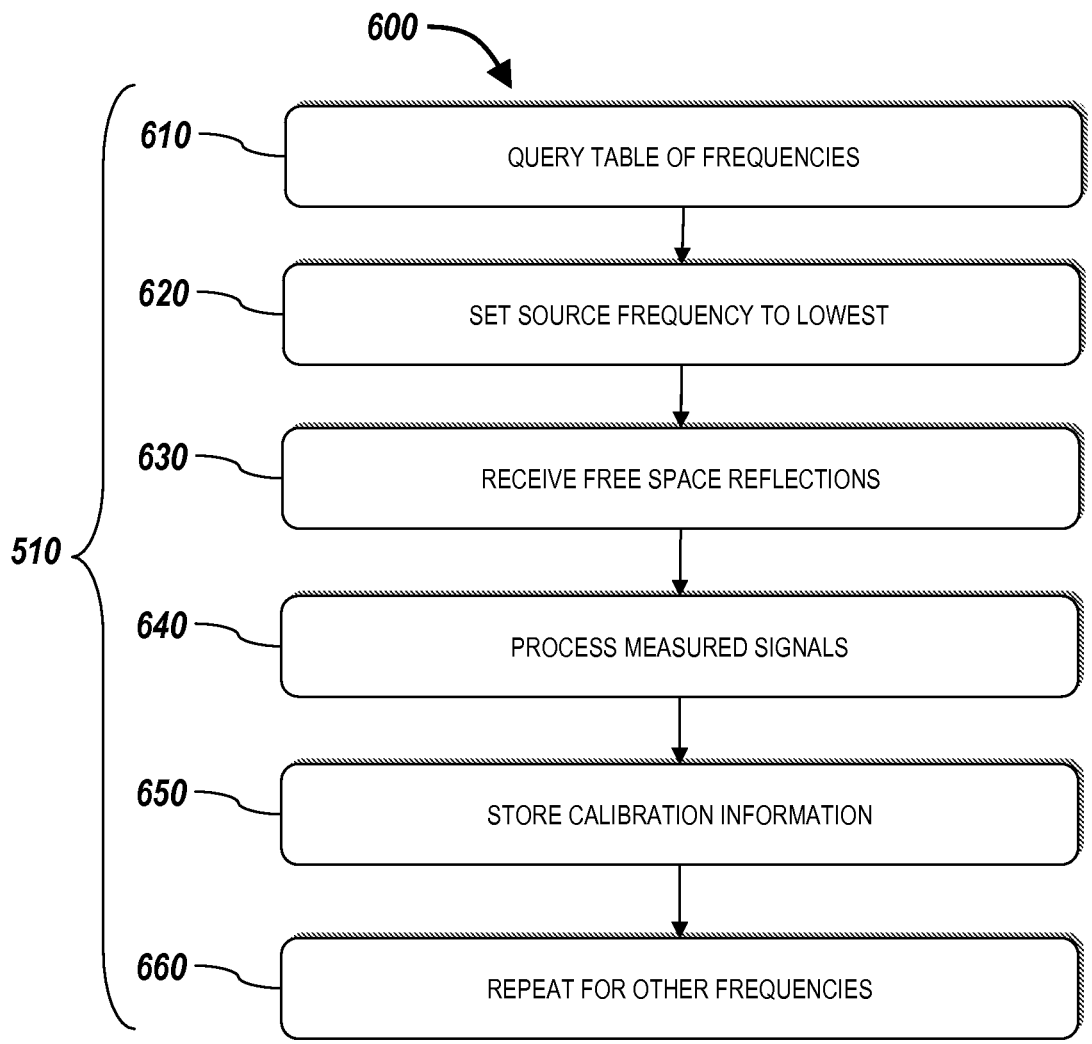
FIG. 6 is a flow chart of an embodiment of a method of calibrating the RFID tag placement apparatus.

With reference to FIG. 6, a method 600 of calibrating the placement apparatus 100 is shown and described. In one embodiment, the method 600 is a free space calibration method that includes querying (STEP 610) a set of calibration frequencies, setting (STEP 620) the source frequency, and measuring (STEP 630) the reflections from the object under test 124. The method also includes processing (STEP 640) the reflected signals, storing (STEP 650) the calibration information, and repeating (STEP 660) the process for other frequencies.

In one embodiment, the table of channel frequencies is prepared and stored within the controller 212. The table of channel frequencies encompasses a range of frequencies that the RFID tag will operate within. For example, for certain North American applications the table can include a frequency range of 902-928 MHz. The range can be divided into 500 KHz wide channels ranging from 902.50 MHz to 927.50 MHz. For other applications, the table of frequencies can be different. For example, different countries such as Canada and Japan have different frequency spectrums designated for RFID tag operation.

After receiving an indication to begin the calibration routine, the controller 212 sets (STEP 620) the signal source 204 to the lowest frequency channel in the channel table. A continuous excitation signal is transmitted from the signal source 204 to the antenna 108. The receiver 208 receives (STEP 630) the returned signal from the antenna 108 which can be coupled by means of the directional coupler to the receiver 208.

The placement apparatus 100 processes (STEP 640) the received signals and determines the magnitude and phase of the returned signal from the antenna 108. Both magnitude and phase information from the returned signals are obtained by the controller 212. The magnitude and phase information may be determined by means of digitization (analog to digital conversion) of in-phase and quadrature signals within the receiver 208 and subsequent digital processing in the controller 212. For example, the execution of a Fast Fourier Transform operations or the execution of a vector magnitude and phase calculation can be used.

In one embodiment, the controller calculates the vector magnitude and phase using the following: magnitude=sqrt (inphaseA2+quadrature^2), phase=arctangent(inphase/quadrature). An orthogonal basis function method may also be employed. In some embodiments, the processing (STEP 640) includes applying one or more types of averaging and outlying point rejection methods to each measured sample to yield a more reliable estimate of returned signal magnitude and phase. For example, a running average can be used.

After processing, the controller 212 stores (STEP 650) the calibration information in an internal data structure. In one embodiment, the data structure consists of a triplet of information (e.g., source frequency, magnitude of returned signal, phase of returned signal). The information can be stored in flash memory 416 or another memory location of the placement apparatus 100 or antenna 108.

After processing, the process repeats (STEP 660) so as to generate calibration information across the frequency range. In one embodiment, the controller 212 sets the operating frequency of the signal source 104 to the next frequency in the channel table. The channel table may consist either of a random or non-random grouping of channels covering the frequency range to be measured. Using such a method, a calibration table may be obtained which reflects the response of the placement apparatus 100 itself, which includes calibrating the antenna 108 that is part of the placement apparatus 100. The inclusion of the antenna 108 is desirable when an interchangeable antenna 108 is used with the placement apparatus 100. The placement apparatus may signal the completion of the calibration process by alerting the user with an audible beep or a message on a display 112.

In another embodiment, the calibration data is supplied with the interchangeable antenna 108. As previously stated, the calibration data can be stored in the memory element 122 that is integral with the antenna 108. If the memory element 122 of the antenna 108 is writeable, updates to the calibration data set can be saved after executing the calibration routine.

Figure 7:
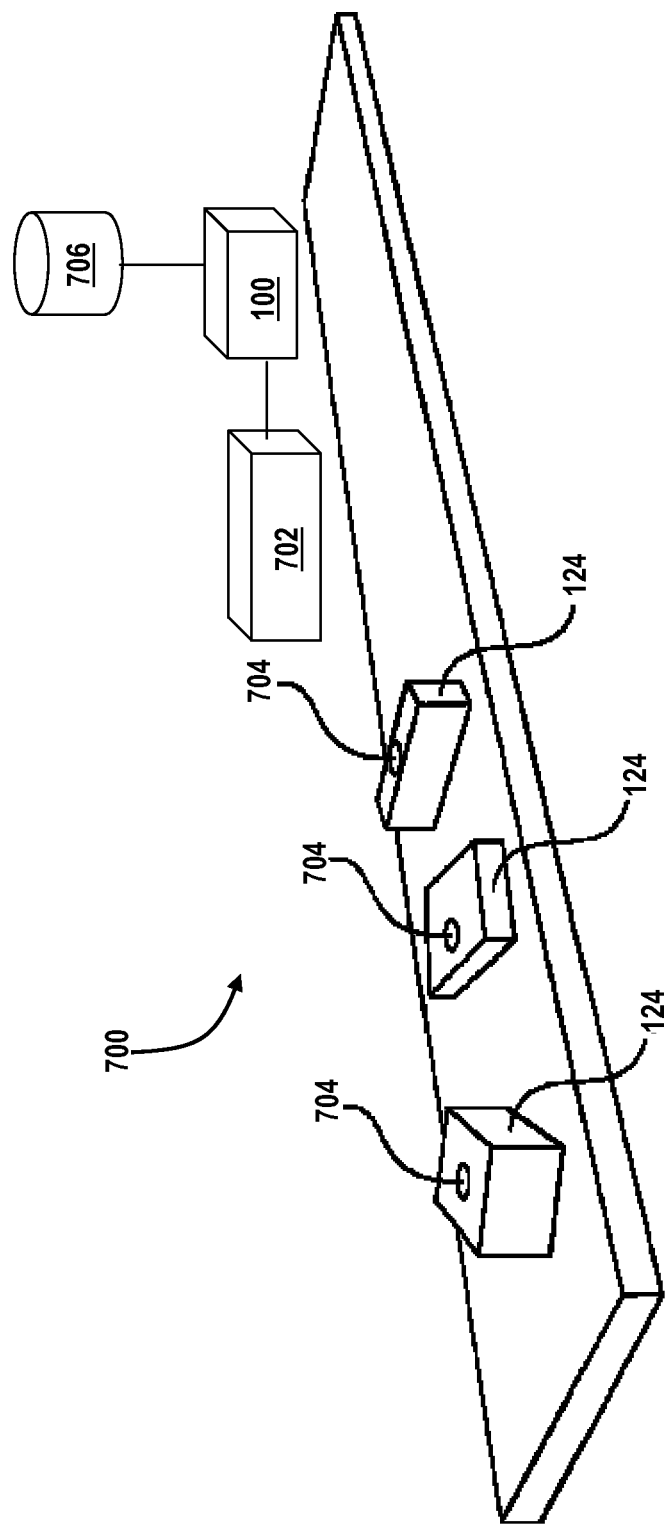
FIG. 7 depicts a block diagram of an embodiment of an automated RFID tag placement system that includes an embodiment of the RFID tag placement apparatus.

Other uses of the tag placement apparatus 100 are described below. For example, the placement apparatus 100 can be used at part of an automated tag placement system. With reference to FIG. 7, in one embodiment the tag placement apparatus 100 is located at a station in a conveyor belt driven system 700 for tag placement that operates with little or no human intervention. In such an embodiment, a tag placement device is incorporated into an existing material handling process (e.g., conveyor belt), or alternatively a new conveyor line is set up to admit a large number of examples of different types of packaged goods. In this way a packaged goods manufacturer can rapidly arrange for the RFID tagging of existing packaged goods, or new packaged goods under development. For example, the placement apparatus 100 can be included as part of the Flexible Automation Solution Tools (FAST) system sold by Accu-Sort Systems.

In one embodiment, the tag placement system 700 may also contain a printing or mechanical marking element 702 that makes a human or machine readable mark 704 on the packaged good 124. The marking element may also mark another substrate that is applied to the packaged good. The marking 704 indicates the calculated tag placement location or encodes the calculated location in a numeric format, either human readable or machine readable, that can be subsequently used to place the RFID tag in that location. In another embodiment, the printing device 702 that communicates with the placement apparatus 100. As objects 124 for tagging pass by the placement apparatus 100, the printing device 702 attached an RFID tag 704 to one or more of the objects 124.

Also, in some embodiments, the location determined by the placement apparatus 100 may be transmitted in numeric form (either by human, or automatically) to a tag applicator machine 702. As previously mentioned, the tag placement machine can be separate from the placement apparatus 100 or co-located with the placement apparatus 110 thus enabling a fully automated process for tagging any packaged good 124.

Another feature provided by certain embodiments includes, storing the calculated location for the object under test 124. The location can be stored in a resident or remote database 706. The location can also be correlated with one or more identifying feature of the packaged good. Examples of identifying features include, but are not limited to, a barcode, an existing RFID carried electronic product code, a universal product code, or any other numbering scheme. The stored information may be used to locate the previously placed tag or quickly identifying a suggested location for the RFID tag if a similar object is presented for analysis.

Another use for the placement apparatus includes integration with a software system that automatically designs (either by selection from a library of existing designs or by an automated design process such as finite element modeling coupled with either genetic optimization or any other form of numerical optimization) a custom-made tag antenna for application to the packaged good. Examples of software programs can include but are not limited to MAXWELL 3D and HFSS sold by ANSOFT Corporation of Pittsburg, Pa. and IE3D sold by Bay Technology of Aptos, Calif.

The resulting standard or custom-made tag antenna can be constructed tag making process involving lithography on an intermediate substrate or the package itself, by ink jet printing, and otherwise applying a conductive material and/or a semiconductor material to either an intermediate substrate or to the package itself. In the latter case, the tag electronics itself may also be co-fabricated either on an intermediate substrate or the package itself to accompany a particular automatically designed, selected, or applied antenna that is customized for a particular package type or family of packaging.

One additional use of the Additionally the Product Information Dataset (PID) mentioned is as an input to a mathematical modeling program, such as any of the finite element modeling program mentioned above, incorporating electromagnetic and/or mechanical information, to assist in the design of future packaging. For example, a packaging engineer may design a candidate package based on appearance, strength, or other properties. The packaging engineer can include a sample of the particular type of packaged good being worked on or a representative sample of a material known to be electrically similar to the final good to be packaged. The placement apparatus 100 may be employed to rate the relative suitability of this candidate package for RFID reading and tagging system performance.

In various embodiments, the PID is expanded to include supplementary information such as a description of or an identifying code representing the materials constituting the packaged good, and optionally their geometric configuration, as may be found in a Computer Aided Design data file. Additional supplementary information may include, but is not limited to calculated financial cost, manufacturing data including mass of the packaged good, special handling required, manufacturing methods, material compatibility for suitability of use with certain families of packaged goods (such as an identification of which materials are compatible with food goods or caustic goods, etc). In some embodiments, the PID includes photographs, X-rays, neutron scattering plots, or any other graphical representation of the packaged good that was examined by the placement apparatus 100. Further embodiments of the PID can include, packaged goods metadata such as disposal or recycling information, or a declaration of any hazardous substances that are contained within the packaged good.

As mentioned above, the PID can be stored in a database. The database can be kept confidential by the user of the placement apparatus 100 or it may be shared with others, such as modeling software companies, RFID tag design companies, manufacturers of similar packaged goods, or subsequent handlers or users of the packaged goods. This sharing may be performed either physically or via a network connection. In addition, the PID may be part of a database that is keyed to the electronic product code, universal product code, the numeric value(s) stored in a barcode on the packaged good, or any other numeric description or parameter of the packaged good.

One advantage of the described PID is that the PID encapsulates the electromagnetic parameters relevant to the placement of RFID tags on that packaged good. Additionally, if some or all of the parameters in the PID are measured during subsequent handling of an unknown or unclassified packaged good, those parameters may be used as part of a search through one or more PIDs to identify the most likely identity of a particular packaged good, to which an RFID tag, barcode, or other indicia may then subsequently be applied to aid in future automatic identification of that packaged good based on any key input into the database.

It will be appreciated that the above-described principles are equally applicable regardless of the frequency of the RFID system, the design of any particular tag antenna, the design of the tag IC itself, the design of the tag's antenna, and the like. Further, the above-described principles support providing placement decision for more than one RFID tag type or more than one RFID tag at the same time. In the latter case, the different RFID tags may contain either the same identifying information or different identifying information that is mapped to the same type of packaged good identifier in a subsequent data processing system. Furthermore, the different RFID tags may be automatically placed based on independent optimization given the tag type (including frequency of operation).

While the invention has been disclosed in connection with the preferred embodiments shown and described in detail, various modifications and improvements thereon will become readily apparent to those skilled in the art. Accordingly, the spirit and scope of the present invention is to be limited only by the following claims.

What is claimed is:

1. An apparatus for scanning an object in the near field, the apparatus comprising:
    a housing that encloses an RF source, a transmitter in communication with the RF source, an antenna in communication with the transmitter, and a receiver; and
    a controller in communication with at least the RF source and the receiver, the controller generating a scan signal that results in irradiation of an object, receiving a reflection signal of the irradiated object, and analyzing at least one property of the reflection signal to determine a suggested location for placement of an RFID tag.

2. The apparatus of claim 1 wherein the antenna is an interchangeable antenna.

3. The apparatus of claim 1 wherein the antenna comprises an array of antenna elements.

4. The apparatus of claim 1 wherein the antenna is selected from the group consisting of a dipole antenna, a resonant coil antenna, a non-resonant coil antenna, a microstrip antenna, a patch antenna, a slot antenna, a spiral antenna, and a logarithmic antenna.

5. The apparatus of claim 1 wherein the controller analyzes the reflected signal to measure the permeability of the object at one or more locations on a surface of the object.

6. The apparatus of claim 1 wherein the controller analyzes the reflected signal to measure the permittivity of the object at one or more locations on a surface of the object.

7. The apparatus of claim 1 wherein the controller analyzes the reflected signal to measure the loss tangent of the object at one or more locations on a surface of the object.

8. The apparatus of claim 1 wherein the controller analyzes the reflected signal to measure the impedance of the antenna when influenced by the object.

9. The apparatus of claim 1 wherein the controller analyzes the reflected signal to measure the complex return loss of the antenna when influenced by the object.

10. The apparatus of claim 1 wherein the controller analyzes the reflected signal by at least estimating the far-field electromagnetic properties of the RFID tag.

11. The apparatus of claim 1 wherein the controller analyzes the reflected signal for nonlinear behavior.

12. The apparatus of claim 1 wherein the controller analyzes the magnitude of the reflected signal.

13. The apparatus of claim 1 wherein the controller analyzes the phase of the reflected signal.

14. The apparatus of claim 1 further comprising a display in communication with the controller, the display indicating a suggested location for placing the RFID tag.

15. The apparatus of claim 1 further comprising an audio transducer in communication with the controller, the audio transducer providing an audio alert to the end-user of the scanning device.

16. The apparatus of claim 1 further comprising a marking apparatus in communication with the controller, the marking apparatus marking the object in the location suggested for tag placement.

17. The apparatus of claim 1 wherein the end-user causes the execution of a calibration routine to calibrate the scanning device prior to scanning the object.

18. The apparatus of claim 17 wherein the calibration routine comprises a free-space calibration routine.

19. The apparatus of claim 17 wherein the controller analyzes the reflected signal and the calibration signal to generate a ratio of the reflected signal to the calibration signal.

20. The apparatus of claim 1 wherein the controller reads calibration data stored with the antenna.

21. The apparatus of claim 1 wherein the housing comprises a hand-held form factor.

* * * * *